April 29, 1958 F. D. WALDHAUER 2,832,846

PHASE-INVERTER COMPLEMENTARY TRANSISTOR AMPLIFIER

Filed April 28, 1955

INVENTOR.
FREDERICK D. WALDHAUER
BY [signature]
ATTORNEY

United States Patent Office 2,832,846

Patented Apr. 29, 1958

2,832,846

PHASE-INVERTER COMPLEMENTARY TRANSISTOR AMPLIFIER

Frederick D. Waldhauer, Haddonfield, N. J., assignor to Radio Corporation of America, a corporation of Delaware Application April 28, 1955, Serial No. 504,518

10 Claims. (Cl. 179—171)

Figure 1:
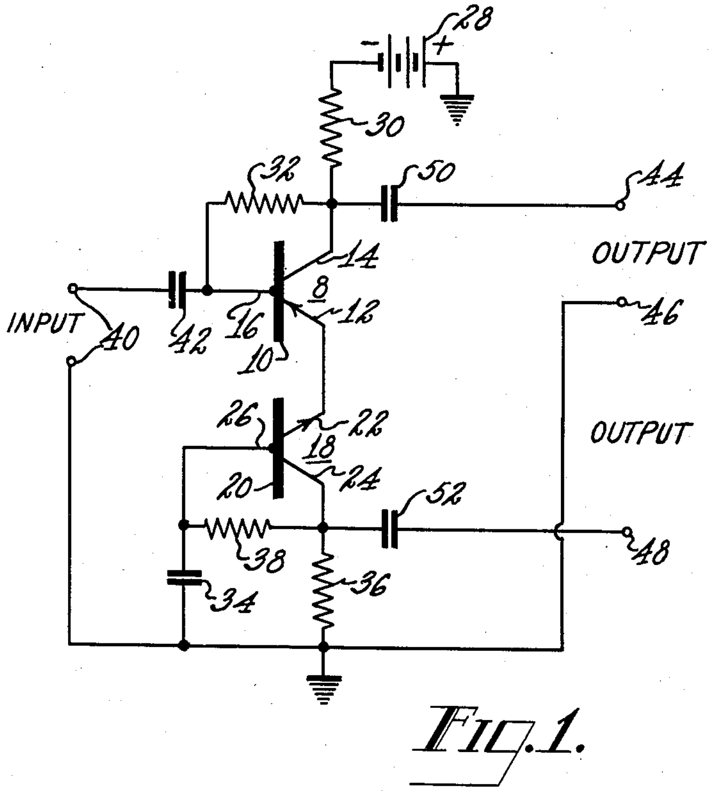

This invention relates in general to signal translating circuits, and in particular to signal translating circuits for providing a balanced output signal from a single-ended signal source.

It is often desired or required to provide out-of-phase currents which are equal in amplitude from a single-ended source of signal energy. An amplifier circuit utilizing a pair of signal amplifying devices connected for push-pull operation, for example, usually required for driving purposes two out-of-phase signals which are equal in amplitude and applied simultaneously to the amplifier devices. To provide the necessary input signal for such a circuit, a transformer having a single primary winding and a center-tapped secondary winding may be used. Such a transformer is relatively costly, however, and often introduces distortion in the circuit operation. Other balanced driving sources may comprise one or more signal amplifying devices such as tubes or transistors. In this general type of phase inverter circuit, it is often difficult to maintain the required signal balance.

It is an object of the present invention to provide an improved transistor signal translating circuit for deriving a pair of output currents which are substantially equal in amplitude and out-of-phase.

It is another object of the present invention to provide a phase-inverter circuit utilizing a pair of opposite conductivity or complementary symmetry transistors for obtaining a balanced signal from a single-ended source.

It is a still further object of the present invention to provide an improved transistor phase-inverter circuit wherein substantially balanced output current is obtainable despite variations in circuit lay-out and wherein circuit operation is relatively stable and efficient.

It is yet another object of the present invention to provide a relatively simple yet reliable phase inverter circuit utilizing a pair of opposite conductivity type transistors which is suitable for use as the driving source for a push-pull amplifier circuit.

These and further objects and advantages of the present invention are achieved, in general, by a phase inverter circuit which uses to advantage the complementary characteristics of transistors. A pair of transistors of opposite conductivity types are connected in series between a source of biasing potential such that their emitters are connected together. The input signal may be applied to the base of either transistor. The output signals are taken from the collectors of each of the transistors and will be equal in amplitude and out-of-phase. Thus a balanced signal is obtained from a single-ended signal source with a circuit which is relatively simple yet reliable in operation.

Figure 2:
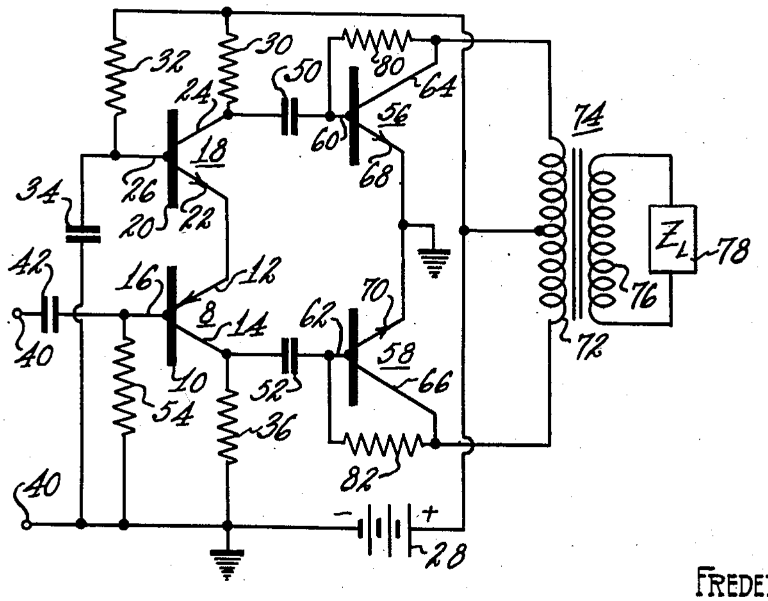

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figure 1 is a schematic circuit diagram of a phase inverter circuit utilizing a pair of transistors of opposite conductivity types and embodying the present invention; and Figure 2 is a schematic circuit diagram of a push-pull amplifier and phase inverter circuit embodying the invention.

Referring now to the drawing, wherein like parts are indicated by like reference numerals throughout the figures, and referring particularly to Figure 1, a phase inverter circuit includes, in accordance with the invention, a pair of transistors 8 and 18 of opposite conductivity or complementary symmetry types. The transistor 8 may be considered to be, for example, a P–N–P junction transistor and includes a semi-conductive body 10 with which an emitter 12, a collector 14 and a base 16 are cooperatively associated in a well known manner. The transistor 18, on the other hand, includes a semi-conductive body 20 and three electrodes which are designated as an emitter 22, a collector 24 and a base 26. It should be understood that other type transistors having characteristics similar to those of junction transistors could be utilized. Moreover, if the transistor 8 is chosen to be of P type conductivity, then the transistor 18 would have to be of N type conductivity and the same circuit connections would be used except that the polarity of the biasing voltages would have to be reversed.

To provide the proper biasing voltages for the transistors 8 and 18, a source of direct current potential, such as illustrated by a battery 28, has its positive terminal grounded and its negative terminal connected through a resistor 30 to the collector 14 of the transistor 8. A feedback stabilizing resistor 32 is connected between the collector 14 and the base 16 of the transistor 8. The base 26 of the transistor 18, on the other hand, is connected for alternating current to circuit ground. To this end, the base 26 is coupled through a capacitor 34 to ground. The collector 24 of the transistor 18 is connected to ground through a resistor 36, while a feedback stabilizing resistor 38 is connected between the collector 24 and the base 26 of the transistor 18.

The transistors 8 and 18 are connected, in accordance with the invention, in series between the biasing source, such as the battery 28, and a point of reference potential, such as circuit ground. Accordingly, the emitter 12 of the transistor 8 is connected directly with the emitter 22 of the transistor 18. Thus a conductive path is provided from the negative terminal of the battery 28 through the resistor 30, the collector-emitter conductive paths of each of the transistors 8 and 18 and the resistor 36 to circuit ground.

An input signal is applied, in accordance with the invention, between the base of one of the transistors and ground. For this purpose, a pair of input terminals 40 are provided, one of which is grounded and the other of which is connected through a coupling capacitor 42 to the base 16 of the P–N–P transistor 8. It should be understood, however, that the input signal could be applied between the base 26 of the transistor 18 and ground. In this case the base 16 of the transistor 8 would be coupled to ground through a coupling capacitor.

A pair of output signals are derived from between the collector of each of the transistors and ground. To this end, three output terminals 44, 46 and 48 are provided. The output terminal 44 is coupled through a coupling capacitor 50 to the collector 14 of the transistor 8, and the output terminal 48 is coupled through a coupling capacitor 52 to the collector 24 of the transistor 18. The common output terminal 46, on the other hand, is grounded so that a first output signal may be derived from between the collector 14 of the transistor 8 and ground and a second output signal, which is equal in amplitude and out-of-phase with respect to the first output signal, may be derived from between the collector 24 of the transistor 18 and ground.

In operation, the application of a signal to the terminals 40 and thus to the base 16 of the transistor 8 will cause an amplified current to flow in the collector 14 of this transistor. The signal current which flows in the emitter 22 of the N–P–N transistor 18 will then be the sum of the base signal current and the collector signal current 14 of the P–N–P transistor 8. If the load impedance of the transistor 18 is low compared with the collector impedance of this transistor, the signal current which flows in the collector 24 of the transistor 18 will be equal to the difference between the emitter signal current and the base signal current of this transistor. Accordingly, the collector signal current of the N–P–N transistor 18 is given by:

$$I_{c_{18}}=I_{c_8}+I_{b_8}-I_{b_{18}}$$

where:

$I_{c_{18}}$=collector signal current of transistor 18
$I_{c_8}$=collector signal current of transistor 8
$I_{b_{18}}$=base signal current of transistor 18
$I_{b_8}$=base signal current of transistor 8

From the above equation for the collector signal current ($I_{c_{18}}$) of the transistor 18, it is seen that if the base signal currents of the two transistors are equal, then the collector currents will also be equal. Thus, the output collector signal currents from the two transistors will be equal in amplitude and out-of-phase.

One of the advantages of the circuit embodying the invention is that substantially balanced currents are obtained even if the circuit components are not in precise balance. By provision of the circuit arrangement described, the output currents are balanced within the percentage differences between the current gain as defined by the ratio of collector current increments to emitter current increments of the two transistors used. Since, moreover, the base current of the transistors is generally much smaller than their collector currents, substantially balanced output currents will still be provided, even though there is a considerable difference in the magnitude of the base currents of the two transistors. Another advantage of the circuit is that the collector-to-emitter impedance of each of the transistors provides direct current emitter degeneration for the other transistor, thus aiding circuit stability. In accordance with the invention, therefore, currents which are equal in amplitude and out-of-phase are obtainable from a single-ended source with a circuit which is relatively simple and stable and efficient in operation.

Circuits embodying the invention are ideally suited for use as the driving source of a push-pull output amplifier stage. Thus, in Figure 2 the transistors 18 and 8 are used to provide the driving signal for a pair of transistors 56 and 58, which are connected for push-pull operation. The phase inverter circuit of Figure 2 is similar to the one illustrated in Figure 1. In Figure 2, however, the conductivity of the transistors has been reversed so that the upper transistor 18 is of P-type conductivity and has its base 26 coupled through the coupling capacitor 34 to ground. Conversely, the lower transistor 8 is of N-type conductivity and has both its collector 14 and its base 16 returned to ground through the transistors 36 and 54 respectively.

An input signal is applied from the terminals 40 between the base 16 of the P–N–P transistor 8 and ground. Alternatively, the input signal could be applied to the base 26 of the transistor 18. In this latter case, however, the base 16 of the transistor 8 would have to be returned to ground through a coupling capacitor. Output signals from the collector 24 and 14 of the transistors 18 and 8 respectively are coupled through the coupling capacitors 50 and 52 respectively to the base electrodes 60 and 62 of the output transistors 56 and 58. The transistor 56 and 58 may each be considered to be junction transistors of the N–P–N type, for example, although other type transistors could be used. Moreover, transistors of N-type conductivity could be used, either by appropriate changes in the bias for the output transistors or by reversing the polarity of the transistors 8 and 18 and reversing the polarity of the battery 28. The transistors 56 and 58 each include, in addition to the base electrodes 60 and 62, collector electrodes 64 and 66 and emitters electrodes 68 and 70, respectively.

The emitter electrodes 68 and 70 of the transistors 56 and 58 are grounded as shown, while the collectors 64 and 66 are connected to either end of a center-tapped primary winding 22 of an output transformer 74. The transformer 74 also includes a secondary winding 76, the ends of which are connected to suitable utilization means or a load, such as a load impedance elemnt 78. Proper biasing for the transistors is provided by the battery 28, the negative terminal of which is grounded and the positive terminal of which is connected through the upper and lower halves of the primary winding 72 to the collectors 64 and 66 respectively, and through the resistor 30 to the collector 24 of the N–P–N transistor 18. Feedback resistors 80 and 82 are connected between the collector and base electrodes of the transistors 56 and 58 respectively.

In operation, the application of an input signal to the input terminals 40 will provide two balanced signals in the collectors 24 and 14 of the transistors 18 and 8 respectively in a manner similar to the circuit of Figure 1. These signals are coupled through the coupling capacitors 50 and 52 respectively to the base electrodes 60 and 62 of the push-pull output transistors 56 and 58 respectively. These signals are amplified in push-pull by the transistors 56 and 58 and the resultant differential signal is applied through the output transformer 74 to the load 78. Thus, by provision of the invention, a phase inverter circuit is provided which is ideally suited as the driving source for a push-pull amplifier circuit.

As described herein, signal translating circuits embodying the invention provide out-of-phase and equal in amplitude signals from a single-ended signal source. The circuits are relatively simple yet reliable and the desired balance of the output signal is maintained without the necessity of maintaining critical overall circuit balance. In addition, stable and substantially distortion-free circuit operation is provided.

What is claimed is:

1. In a signal translating circuit, the combination with a first transistor of one conductivity type including a first base, a first emitter and a first collector electrode, and a second transistor of an opposite conductivity type including a second base, a second emitter and a second collector electrode, of means connecting said transistors in series with a direct-current supply source including means connecting said first emitter electrode with said second emitter electrode, input circuit means for applying an input signal to the base of only one of said transistors, and first and second output circuit means coupled with said first and second collector electrodes respectively for deriving substantially balanced output currents therefrom in response to an input signal applied to the base of said one of said transistors.

2. A signal translating circuit as defined in claim 1, wherein said first transistor is a P–N–P junction transistor and said second transistor is an N–P–N junction transistor.

3. A signal translating circuit as defined in claim 1, wherein said second base electrode is coupled to ground and said input signal is applied to said first base electrode.

4. In a phase inverter circuit for providing an output signal which is balanced with respect to a point of reference potential therein, the combination comprising, a first transistor of one conductivity type including a first base, a first emitter and a first collector electrode, a second transistor of an opposite conductivity type including a second base, a second emitter and a second collector electrode, means for applying an input signal between said first base electrode and said point, means connecting said first emitter electrode directly with said second emitter electrode, means providing a source of biasing potential connected with one of said collector electrodes, impedance means connecting the other of said collector electrodes with said reference potential point, signal conductive coupling means coupling said second base electrode with said point, means providing a first output circuit coupled between said first collector electrode and said reference potential point for deriving a first output signal therefrom, and means providing a second output circuit coupled between said second collector electrode and said point for deriving a second output signal therefrom which is out-of-phase with respect to said first output signal.

5. Signal translating circuit means for providing a pair of out-of-phase output signals from a single-ended signal source comprising, in combination, a pair of opposite conductivity type transistors each having a base, an emitter and a collector electrode, direct current conductive circuit means connecting said transistors in series between a source of biasing potential and a point of fixed reference potential including means directly connecting the emitter electrode of one transistor to the emitter electrode of the other transistor, means for applying an input signal to the base electrode of one of said transistors, and means for deriving a first output signal from the collector electrode of one of said transistors and a second output signal from the collector electrode of the other of said transistors, said second output signal being out-of-phase with respect to said first output signal.

6. In a phase inverter circuit including a point of ground potential therein, the combination comprising, a first junction transistor of one conductivity type including a first base, a first emitter and a first collector electrode, a second transistor of an opposite conductivity type including a second base, a second emitter and a second collector electrode, means for applying an input signal between said first base electrode and said point of ground potential, means connecting said first emitter directly with said second emitter electrode, means providing a source of biasing potential connected with one of said collector electrodes, a resistor serially connected between the other of said collector electrodes and said point of ground potential, a capacitor serially connected between said second base electrode and said point of ground potential, means providing a first output circuit coupled between said first collector electrode and said point of ground potential for deriving a first output signal therefrom, and means providing a second output circuit coupled between said second collector electrode and said point of ground potential for deriving a second output signal therefrom which is out-of-phase with said first output signal.

7. In a signal translating circuit including a point of reference potential therein, the combination comprising, a pair of transistors of opposite conductivity types each including a base electrode and a collector and an emitter electrode adapted to provide a collector-emitter conductive path therebetween, means providing a source of biasing voltage for said transistors, conductive circuit means serially connecting the collector-emitter conductive paths of said transistors between said source and said point of reference potential, means providing an input circuit for applying an input signal to the base electrode of one of said transistors, and means providing an output circuit coupled with the collector electrode of each of said transistors for providing out-of-phase output currents therefrom.

8. Signal translating circuit means for providing a balanced output signal from a single-ended signal source comprising, in combination, a pair of opposite conductivity type transistors each having a base, an emitter and a collector electrode, direct current conductive circuit means connecting the emitter electrode of one transistor to the emitter electrode of the other transistors and said transistors in series with a source of direct current biasing potential, input circuit means for applying an input signal to the base electrode of one of said transistors, and output circuit means for simultaneously deriving a first output signal from the collector electrode of one of said transistors and a second output signal from the collector electrode of the other of said transistors, said second output signal being substantially equal to and out-of-phase with said first output signal.

9. In combination with a push-pull signal amplifier circuit including a first transistor having a first base, a first collector and first emitter electrode, a second transistor having a second base, a second collector and a second emitter electrode, and means providing an output circuit connected with said first and second collector electrodes, of a phase inverting driving stage for said amplifier circuit including a third transistor of one conductivity type including a third base, a third emitter and a third collector electrode, and a fourth transistor of an opposite conductivity type including a fourth base, a fourth emitter and a fourth collector electrode, means directly connecting said third emitter electrode with said fourth emitter electrode, input circuit means for applying an input signal to the base of one of said third and fourth transistors, and means coupling said third collector electrode with said first base electrode and said fourth collector electrode with said second base electrode for providing balanced output currents for said push-pull signal amplifier circuit.

10. The combination as defined in claim 9, wherein said first and second transistors are of the same conductivity type.

References Cited in the file of this patent

UNITED STATES PATENTS

| | | |
|---|---|---|
| 2,240,635 | Avins | May 6, 1941 |
| 2,338,342 | Lissman | Jan. 4, 1944 |

OTHER REFERENCES

Shea: "Principles of Transistor Circuits," publ. John Wiley and Sons, 1953 (particularly pp. 153, 156 and pp. 295–299).

Electronics, September 1953, pp. 140–143, Lohman, "Complementary Symmetry Transistor Circuits."

"Elec. Eng.," vol. 25, issue 307, September 1953, pp. 358–364, Sziklai, "Transistor Circuits and Applications."